United States Patent [19]

Collins

[11] 4,175,289
[45] Nov. 20, 1979

[54] SERRATED Y-BAR MAGNETIC BUBBLE SWITCH

[75] Inventor: Thomas W. Collins, Saratoga, Calif.

[73] Assignee: International Business Machines Corporation, Armonk, N.Y.

[21] Appl. No.: 912,805

[22] Filed: Jun. 5, 1978

[51] Int. Cl.$^2$ ............................................. G11C 19/08
[52] U.S. Cl. .......................................... 365/15; 365/39
[58] Field of Search ............................... 365/15, 16, 39

[56] References Cited

U.S. PATENT DOCUMENTS 3,713,116   1/1973   Bonyhard et al. ....................... 365/16

OTHER PUBLICATIONS

IEEE Transactions on Magnetics–vol. Mag.–13, No. 5, Sep. 1977, pp. 1264–1266.
IEEE Transactions on Magnetics–vol. Mag.–13, No. 4, Jul. 1977, pp. 1035–1041.
IEEE Transactions on Magnetics–vol. Mag.–9, No. 3, Sep. 1973, pp. 481–484.

Primary Examiner—James W. Moffitt
Attorney, Agent, or Firm—Joseph E. Kieninger

[57] ABSTRACT

A magnetic bubble switch operates in a drive-to-transfer mode when a rotating magnetic field is applied. The switch has a magnetic element in the shape that defines the letter "Y" having two arms and a stem. The switch has at least one serration on the arm of the Y in the vicinity of the stem. The switch has a conductor which is positioned across the end of the stem of the Y. A magnetic element is positioned so as to form a gap with the stem of the Y.

14 Claims, 3 Drawing Figures

SERRATED Y-BAR MAGNETIC BUBBLE SWITCH

DESCRIPTION

TECHNICAL FIELD

This invention relates to magnetic bubble domain devices, and more particularly to a switch for transferring bubbles between different shift registers.

It is a primary object of this invention to provide an improved bubble domain switch.

It is another object of this invention to provide an improved Y-bar magnetic bubble domain switch.

It is still another object of this invention to provide an improved drive-to-transfer bubble switch.

BACKGROUND ART

Magnetic bubble domain devices are well known in the art, and in many of these devices it is necessary to transfer bubble domains from one shift register to another. For example, in a major/minor loop type of memory organization, such as is shown in U.S. Pat. No. 3,618,054, bubble domains are transferred between the input/output major loop and the storage minor loops.

Many devices have been described in the prior art for transferring bubble domains from one shift register to another. In general, a good current controlled transfer switch is one which has very low current amplitude requirements even when small bubble domains are used. Additionally, a good transfer switch should be compatible with conventional propagation elements used to move bubble domains in shift registers, and should be such that its design is compatible with the design used for the propagation elements in the shift registers. Further, a switch which can be used for all transfer functions on the magnetic chip is desirable. A switch capable of symmetrical transfer should operate with the same margins regardless of the direction of transfer. Another important criterion for a good transfer switch is that it provide good margins for switching and be reliable in its operation regardless of the manner in which it is fabricated. Still further, it is desirable that the transfer switch be an integral part of the propagation structure used to move magnetic bubble domains.

In the prior art, various bubble domain transfer switches are described using current carrying overlays to switch bubble domains from one propagation track to another in response to an electrical signal pulse. Typically, the current carrying conductors are designed in a loop configuration so that a current pulse in the conductor will generate a localized magnetic field within the loop. This localized field temporarily adds to the fields of the propagation elements in that region and provides an additional attractive or repulsive force on magnetic bubble domains approaching that region. In this manner, the bubble domain is preferentially attracted or repulsed in order to determine the propagation track along which it will move. A representative example of such a switch is shown in the IBM Technical Disclosure Bulletin, Vol. 15, No. 2, July 1972 at page 703. In that switch, bubble domains arrive at a point of ambiguity where two possible positions are available for subsequent bubble domain movement. Current in a conductor determines which path will be taken by the bubble, thus resolving the ambiguity of the switch.

A replicate type of switch using a current carrying loop is described by Bobeck et al in IEEE Transactions on Magnetics, Vol. MAG-9, No. 3, Sept. 1973, at pages 474–480. In this type of switch, current is used to stretch a bubble domain so that it will transfer to a different propagation channel, while an additional amount of current is used to replicate the stretched domain. This type of switch requires high currents and is difficult to incorporate in a single level metallurgy design.

Another version of the replicate switch described in the previous paragraph has been shown by T. J. Nelson, in AIP Conference Proceedings, 18, 95 (1974). This is an all-permalloy switch in which a current conducting path is comprised of permalloy deposited at the same time as the permalloy propagation elements. Transfer from one propagation channel to another utilizes a current along a straight permalloy path linking the propagation channels. A disadvantage of this transfer switch is that very high currents are required when the bubble diameter is small, of the order of one micron and less in diameter. Physically, this switch is large and thus is not compatible with densely packed major/minor loop designs.

Still another transfer switch employing a current carrying conductor is shown in U.S. Pat. No. 3,876,995. A double loop conductor is used to establish a magnetic field which attracts a bubble toward one propagation track and at the same time establishes another magnetic field tending to repel the bubble from another propagation track. Additionally, this patent shows a transfer switch which uses no current. Instead, two bubble propagation tracks merge at a junction.

A relatively new switch design which is particularly suitable for use with small magnetic bubbles and a rotating magnetic field is described in patent application Ser. No. 709,358 filed July 28, 1976, now abandoned and assigned to the assignee of the present invention. This switch element has propagation paths which generally define the letter "Y". These propagation paths are from one arm of the "Y" to the other arm, from one arm of the "Y" to the stem or base portion, or the reverse where a bubble domain travels from the stem or base of the "Y" to one of the arms of the "Y". In addition to having a "Y" shaped element, there is a current carrying conductor which crosses the stem portion of the "Y" shaped magnetic element. The particular path traveled by bubble domain through the transfer switch is determined by the presence or absence of a current through the conductor. This type of switch is generally referred to as a drive-to-retain switch since it is necessary to apply a current continuously in the conductor in order to keep the bubbles from switching. In other words, the current is turned off when a bubble is to be switched. With drive-to-retain switches, the on-chip power dissipation is considerable.

BRIEF DESCRIPTION OF THE DRAWING

In the accompanying drawing forming a material part of this disclosure.

DISCLOSURE OF INVENTION

For a further understanding of the invention and of the objects and advantages thereof, reference will be had to the following description and accompanying drawing, and to the appended claims in which the various novel features of the invention are more particularly set forth.

A magnetic bubble switch operates in a drive-to-transfer mode when a rotating magnetic field is applied. A drive-to-transfer switching mode occurs when it is necessary to apply a current to the conductor associated with the switch in order to cause the bubbles to be switched from one bubble path to a second bubble path.

A drive-to-transfer switching mode is different from a drive-to-retain switching mode where it is necessary to continuously apply a current to the conductor in order to keep the bubbles on one, i.e., the same, bubble path. With a drive-to-retain switch a bubble is switched from one bubble path to a second bubble path when the current is turned off. The drive-to-transfer switch has a magnetic element in the shape that defines the letter "Y" having two arms and a stem. The switch has at least one serration on the arm of the Y in the vicinity of the stem. The switch has a conductor which is positioned across the end of the stem of the Y. The use of the serrations on the arm of the Y optimizes the switch performance while operating in a drive-to-transfer mode. In the absence of current in the conductor, a bubble positioned near the end of the stem is attracted to the serration as the magnetic field rotates. Under these conditions, there is no switching when the magnetic field is rotated. The propagation path in this case is along one arm of the Y to the stem and then continuing along the other arm having the serration. In the presence of current in the conductor, a bubble positioned near the end of said stem retains that position as the magnetic field rotates. Under these conditions, there is switching when the magnetic field is further rotated. The propagation path in this case is along one arm of the Y to the stem and then continuing down the stem to another magnetic element that is, for example, associated with a minor loop.

BEST MODE FOR CARRYING OUT THE INVENTION

Figure 1:
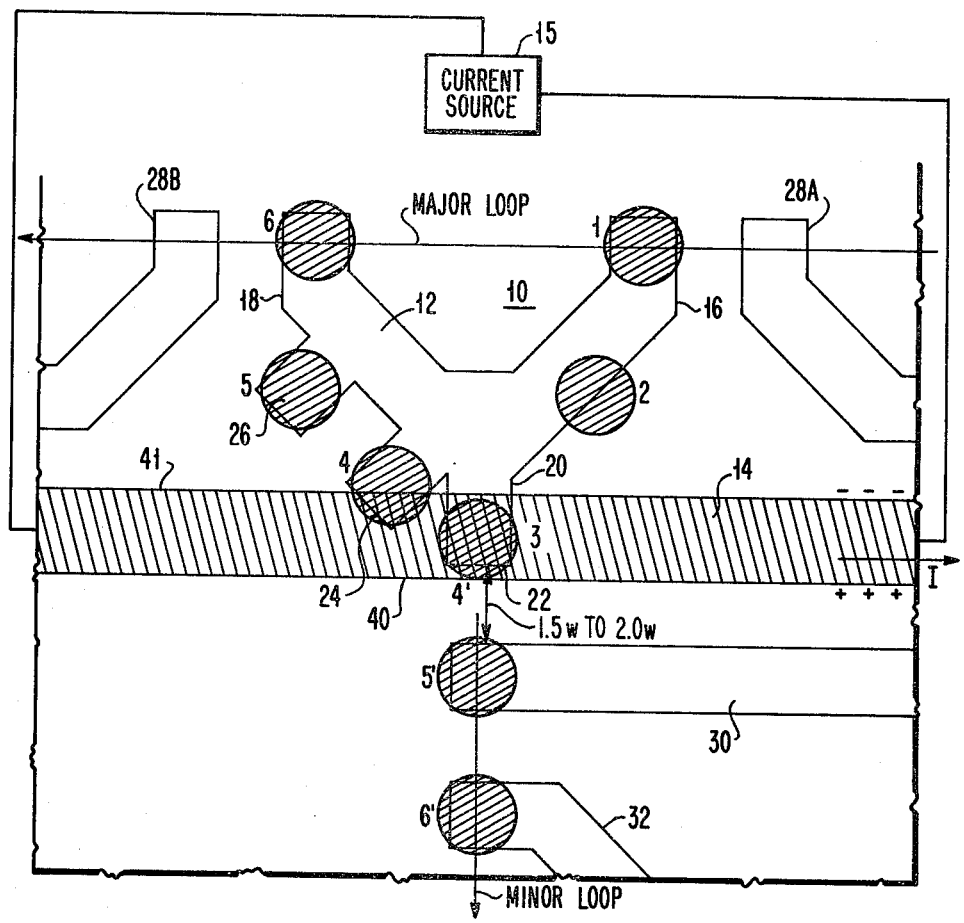
FIG. 1 is a top view illustrating the serrated Y-bar bubble switch.
Figure 3:
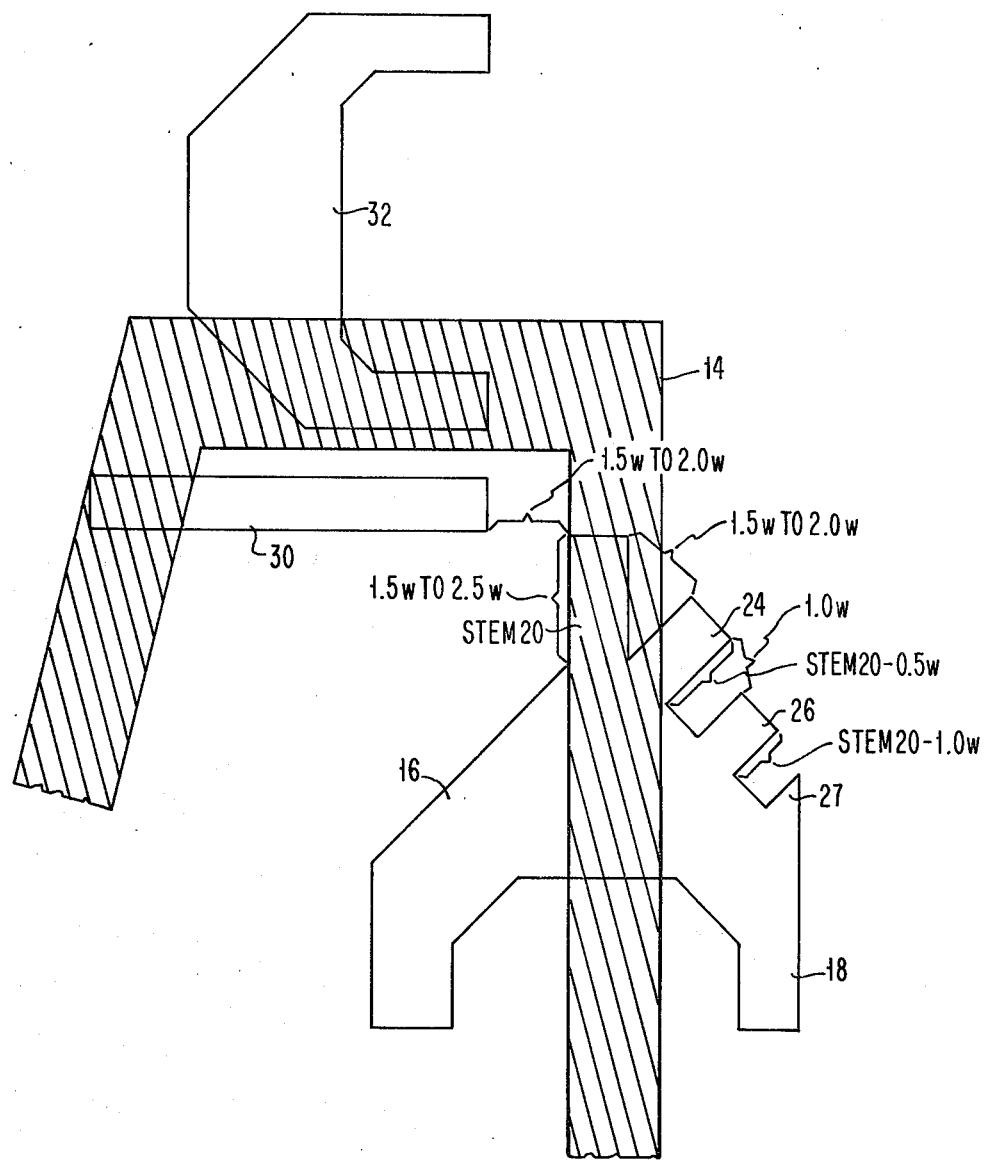
FIG. 3 is a top view illustrating a second embodiment of the serrated Y-bar bubble switch.

We first describe the serrated Y-bar magnetic bubble switch according to the invention. Referring to FIG. 1, the switch 10 consists of a magnetic element 12 having a shape generally defining the letter Y and having arms 16 and 18 which joins stem 20. A conductor 14 is positioned over the end 22 of the stem 20 and is connected to current source 15. The conductor 14 may have the shape of a straight line or a loop as shown in FIG. 3 as long as a portion thereof passes over the end of the stem 20. Arm 18 has a serration 24 near the stem 20. Arm 18 in the preferred embodiment shown in FIG. 1 has a second serration 26 that is near serration 24.

In accordance with this invention, the Y shaped element 12 must have at least one serration on one of the arms. In FIG. 1, the serration 24 facilitates the propagation of a bubble up arm 18 from stem 20 when the current is off. The presence of a second serration 26 or a third serration 27 as shown in FIG. 3 assist the bubble in moving up arm 18.

The length of the stem 20 is between 1.5 to 2.5 as shown in FIG. 3 where w is one-half the diameter of the bubble domain being propagated. Preferably, the stem length is 2 w. The length of the first serration 24 is about 0.5 w shorter than the length of the stem as shown in FIG. 3. Hence, when the length of the stem is 2 w, the length of the first serration 24 is 1.5 w. The length of the second serration 26 is about 0.1 w shorter than the stem 20 as illustrated in FIG. 3. Thus, when the length of the stem 20 is 2 w and the length of the serration 24 is 1.5 w, the length of the serration 26 will be 1.0 w. The distance between the serration 24 and the serration 26 is about 1.0 w from the operating surfaces of the two serrations as shown in FIG. 3. The distance between the serration 24 and the stem 20 is about 1.5 w to 2.0 w as shown in FIG. 3. The width of stem 20 and serrations 24 and 26 is the same as conventional propagation elements, i.e. 1.0 w.

The operation of the switch shown in FIG. 1 will now be described in detail. This switch 10 in accordance with this invention is suitable for switching bubbles from a major loop into a minor loop as shown in FIG. 1. It is also suitable for use for switching bubbles from a minor loop back into the major loop. In FIG. 1, bubbles from a magnetic element 28A in a major loop are propagated into the switch element 12 into bubble position 1 as shown in FIG. 1. As the magnetic field is rotated to the position shown in FIG. 2, a bubble will propagate down arm 16 to bubble position 2 and then into bubble position 3 on stem 20.

When it is desired to keep the bubbles in the major loop portion and not to transfer it into the minor loop, no current is applied to the conductor 14. In this case, as the field rotates to position 4, the bubble is attracted to the first serration 24 and to bubble position 4. As the field rotates to position 5 in FIG. 2, the bubble moves up arm 18 to serration 26 and to bubble position 5. Additional field rotation moves the bubble up to the end of arm 18 to the bubble position 6 as shown. Further rotation would propagate the bubble in bubble position 6 into the next magnetic element 28B in the major loop.

When it is desired to switch the bubble from the major loop into the minor loop, current is applied to conductor 14 while the bubble is positioned at the end of the stem 20 in bubble position 3. The application of current in the conductor 14 makes the edge 40 of the conductor attractive and the edge 41 of the conductor repulsive. The bubble is forced to and held at the edge 40 of the conductor. As the field rotates, the bubble remains held at the edge 40 of the conductor at bubble position 4'. The conductor edge 41, which is repulsive to the bubble, cancels the attractive edge of the serration 24 and prevents the bubble from propagating from the stem 20 to the serration 24. The current only needs to be applied for up to a quarter of the rotating field cycle time as shown by the shaded area from 3 to 5, 5' in FIG. 2. At 5' time, the bubble moves to the magnetic element 30, preferably an I-bar, to bubble position 5' as the current in conductor 14 is turned off. The bubble is then transferred into the minor loop element 32 as the field rotates to 6 time and the bubble is positioned at bubble position 6'.

The width of the gap between stem 20 and magnetic bar element 30 is 1.5 w to 2.0 w as shown in FIG. 1 and FIG. 3 with 2.0 w being preferred. Although the element 30 is shown in FIG. 1 to be directly beneath stem 22, the element 30 may be positioned on the side of the stem 20 under arm 16 as shown in FIG. 3 so as to have the same effective gap width as well as intermediate positions between the two positions referred to herein. The width of the conductor is 1.0w to 2.0w and its preferred position is when the conductor edge 40 is placed 0.5w beyond the edge 22 of stem 20.

Figure 2:
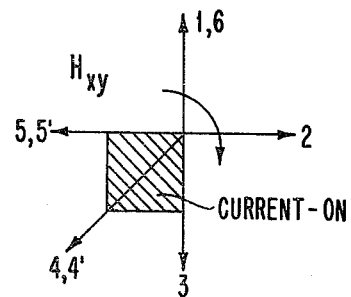
FIG. 2 illustrates the rotating magnetic field direction and the current in relationship with the bubble position in the switch.

FIG. 2 illustrates the rotating magnetic field positions as well as when the current is applied to conductor 14.

INDUSTRIAL APPLICABILITY

The primary advantage of a serrated Y-bar drive-to-transfer switch in accordance with this invention is to eliminate the on chip power dissipation normally associated with a drive-to-retain switch. For a drive-to-transfer switch to operate properly, the bubble must propagate from the stem up the downstream side of the Y-bar when the current is off. In addition, the bubble must not replicate across the switch, that is, from position 5' to 5, when the current is on. Hence, for propagation purposes up the downstream side of the Y-bar, it is desirable that the Y-bar on that side be wide and the stem to be short. In addition, it is desirable for the Y-bar to be narrow along that same arm and the stem to be long so that no replication occurs when the current is on. This conflict over characteristics is resolved by the use of this serrated design.

With no current on. the first serration attracts the bubble before the I-bar in the minor loop does. The other serrations help the bubble up the Y-bar.

With the current on, the current attracts the bubble to the lower edge of the conductor while the upper edge of the conductor tends to cancel the pole of the serration.

Switches made in accordance with this invention are useful in applications where switches are needed in bubble devices. For example, they may be used in particular major/minor loop memory storage devices.

While I have illustrated and described the preferred embodiment of my invention, it is understood that I do not limit myself to the precise constructions herein disclosed and the right is reserved to all changes and modifications coming within the scope of the invention as defined in the appended claims.

I claim:

1. A switch for bubble domains adapted to operate in a drive-to-transfer mode comprising:
   a first magnetic element for propagating bubble domains and having a shape generally defining the letter Y with first and second arms and a stem, said element having a first propagation path along said first arm of said Y into said stem and then along said second arm of said Y, said element having a second propagation path along said first arm of said Y and then outward along said stem;
   at least one serration connected to said second arm and in the vicinity of said stem;
   a conductor positioned over the end of said stem and
   a second magnetic element for propagating bubble domains being located a distance of about 1.5w to 2.0w from said stem where w is one-half the diameter of the bubble domain wherein in the absence of current in said conductor, a bubble positioned near the end of said stem is propagated to said serration as the magnetic field rotates and then along the second arm of said Y, and in the presence of current in said conductor a bubble positioned near the end of said stem is propagated outward away from said stem as the magnetic field rotates to said second magnetic element.

2. A switch as described in claim 1 including a second serration.

3. A switch as described in claim 1 including a second and a third serration.

4. A switch as described in claim 1 wherein said first serration is located a distance of about 1.5w to 2.0w from said stem where w is one-half the diameter of the bubble domain.

5. A switch for bubble domains adapted to operate in a drive-to-transfer mode comprising:
   a first magnetic element for propagating bubble domains and having a shape generally defining the letter Y with first and second arms and a stem, said element having a first propagation path along said first arm of said Y into said stem and then along said second arm of said Y, said element having a second propagation path along said first arm of said Y and then along said stem, the length of said stem being about 1.5w to 2.5w where w is one-half the diameter of the bubble domain;
   at least one serration connected to said second arm and in the vicinity of said stem;
   a conductor positioned over the end of said stem; and
   a second magnetic element for propagating bubble domains being located a distance of about 1.5w to 2.0w from said stem where w is one-half the diameter of the bubble domain wherein in the absence of current in said conductor, a bubble positioned near the end of said stem is propagaged to said serration as the magnetic field rotates and then along the second arm of said Y, and in the presence of current in said conductor a bubble positioned near the end of said stem is propagated outward away from said stem as the magnetic field rotates to said second magnetic element.

6. A switch as described in claim 5 wherein the length of a first serration is 0.5w shorter than said stem.

7. A switch as described in claim 5 including a second serration connected to said second arm wherein the length of said second serration is 1.0w shorter than said stem.

8. A switch as described in claim 5 wherein the length of said stem is about 2w.

9. A switch as described in claim 8 wherein the length of a first serration is 1.5w.

10. A switch for bubble domains adapted to operate in a drive-to-transfer mode comprising:
    a first magnetic element for propagating bubble domains and having a shape generally defining the letter Y with first and second arms and a stem, said element having a first propagation path along said first arm of said Y into said stem and then along said second arm of said Y, said element having a second propagation path along said first arm of said Y and then along said stem;
    a first serration connected to said second arm and in the vicinity of said stem;
    a second serration connected to said second arm and in the vicinity of said stem, said second serration located so that the midpoint thereof is about 1.0w from the midpoint of said first serration and where w is one-half the diameter of the bubble domain;
    a conductor positioned over the end of said stem; and
    a second magnetic element for propagating bubble domains being located a distance of about 1.5w to 2.0w from said stem where w is one-half the diameter of the bubble domain wherein the absence of current in said conductor, a bubble positioned near the end of said stem is propagated to said serration as the magnetic field rotates and then along the second arm of said Y, and in the presence of current in said conductor a bubble positioned near the end of said stem is propagated outward away from said stem as the magnetic field rotates to said second magnetic element.

11. A switch as described in claim 10 wherein said conductor has a shape taken from the group consisting of a straight line and a loop.

12. A switch as described in claim 10 including a current source adapted to apply a current pulse for up to a quarter of the rotating field cycle time.

13. A switch as described in claim 10 wherein said second magnetic element is located directly opposite the end of said stem.

14. A switch for bubble domains adapted to operate in a drive-to-transfer mode comprising:
a first magnetic element for propagating bubble domains and having a shape generally defining the letter Y with first and second arms and a stem, said element having a first propagation path along said first arm of said Y into said stem and then along said second arm of said Y, said element having a second propagation path along said first arm of said Y and then outward along said stem, the length of said stem being about 1w where w is one-half the diameter of the bubble domain;
a conductor positioned over the end of said stem; and
a second magnetic element for propagating bubble domains being located a distance of about 1.5w to 2.0w from said stem wherein in the absence of current in said conductor, a bubble positioned near the end of said stem is propagated along the second arm of said Y, and in the presence of current in said conductor a bubble positioned near the end of said stem is propagated outward away from said stem as the magnetic field rotates to said second magnetic element.

* * * * *

UNITED STATES PATENT AND TRADEMARK OFFICE
CERTIFICATE OF CORRECTION

PATENT NO. : 4,175,289
DATED : November 20, 1979
INVENTOR(S) : THOMAS W. COLLINS It is certified that error appears in the above-identified patent and that said Letters Patent are hereby corrected as shown below:

Col. 4, line 5, delete the word "operating" and insert in its place --opposing--.

Signed and Sealed this

Fifteenth Day of July 1980

[SEAL]

Attest:

SIDNEY A. DIAMOND

Attesting Officer     Commissioner of Patents and Trademarks